United States Patent
Park

(10) Patent No.: US 8,104,912 B2
(45) Date of Patent: Jan. 31, 2012

(54) LIGHT EMITTING MODULE, BACKLIGHT UNIT, AND DISPLAY APPARATUS

(75) Inventor: Jun Seok Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/006,594

(22) Filed: Jan. 14, 2011

(65) Prior Publication Data

US 2011/0176293 A1 Jul. 21, 2011

(30) Foreign Application Priority Data

Jan. 15, 2010 (KR) ........................ 10-2010-0004111

(51) Int. Cl.
*G02F 1/13357* (2006.01)

(52) U.S. Cl. ..................... 362/97.3; 362/97.2

(58) Field of Classification Search .............. 362/97.3, 362/97.2, 97.1, 231, 260
See application file for complete search history.

(56) References Cited

U.S. PATENT DOCUMENTS

| | | | |
|---|---|---|---|
| 6,789,921 B1 * | 9/2004 | Deloy et al. | 362/97.3 |
| 2002/0163302 A1 | 11/2002 | Nitta et al. | 313/512 |
| 2006/0049475 A1 | 3/2006 | Wang et al. | 257/432 |
| 2008/0100772 A1 | 5/2008 | Lin et al. | 349/61 |
| 2008/0149373 A1 * | 6/2008 | Kim et al. | 174/255 |
| 2008/0231169 A1 | 9/2008 | Hata et al. | 313/500 |
| 2009/0067158 A1 * | 3/2009 | Hamada | 362/97.3 |
| 2009/0262520 A1 * | 10/2009 | Park et al. | 362/97.1 |
| 2009/0294780 A1 | 12/2009 | Chou et al. | 257/88 |

FOREIGN PATENT DOCUMENTS

| | | |
|---|---|---|
| JP | 2002-314142 A | 10/2002 |
| JP | 2006-339224 A | 12/2006 |
| JP | 2007-80866 A | 3/2007 |
| KR | 10-2006-0025724 A | 3/2006 |
| KR | 10-0658936 B1 | 12/2006 |
| KR | 10-2008-0057881 A | 6/2008 |
| KR | 10-2008-0071735 A | 8/2008 |
| KR | 10-2008-0095576 A | 10/2008 |
| KR | 10-2009-00110058 A | 10/2009 |
| KR | 10-2010-0030389 A | 3/2010 |

OTHER PUBLICATIONS

Korean Office Action dated Mar. 4, 2011 issued in Application No. 10-2010-0004111.
European Search Report dated Sep. 5, 2011 issued in Application No. 11 15 0794.

* cited by examiner

*Primary Examiner* — David V Bruce
(74) *Attorney, Agent, or Firm* — KED & Associates, LLP

(57) ABSTRACT

Provided is a light emitting module, which includes a module board, a light emitting diode, and a resin material. The module board includes a plurality of holes. The light emitting diode is in the hole. The resin material is in the hole. The module board includes a printed circuit board (PCB), and the PCB includes a photo solder resist (PSR) layer, an electrical conduction layer, and an insulation layer.

17 Claims, 5 Drawing Sheets

LIGHT EMITTING MODULE, BACKLIGHT UNIT, AND DISPLAY APPARATUS

CROSS-REFERENCE TO RELATED APPLICATIONS

The present application claims priority under 35 U.S.C. §119(a) of Korean Patent Application No. 10-2010-0004111 filed on Jan. 15, 2010, which is hereby incorporated by reference in its entirety.

BACKGROUND

Embodiments relate to a light emitting module, a backlight unit, and a display apparatus including the backlight unit.

Display apparatuses comprise a cathode ray tube (CRT), a liquid crystal display (LCD) using an electric field and optical effect, a plasma display panel (PDP) using a gas discharge, and an electro luminescence display (ELD) using a field emission effect. Especially, research is being actively carried out on liquid crystal displays.

Since the LCDs are light receiving apparatuses that display an image by controlling the amount of light incident from the outside, a separate light source, that is, a backlight assembly is required to provide light onto a LCD panel.

SUMMARY

Embodiments provide a light emitting module, backlight unit, and a display apparatus including the backlight unit, which can reduce material costs of the backlight unit.

Embodiments also provide a light emitting module, a backlight unit, and a display apparatus including the backlight unit, which can effectively emit heat from light emitting devices of the backlight unit.

In one embodiment, a light emitting module comprises: a module board including a plurality of holes; a light emitting diode disposed in the hole; and a resin material disposed in the hole, wherein the module board includes a printed circuit board (PCB) having a photo solder resist (PSR) layer, an electrical conduction layer, and an insulation layer.

In another embodiment, a backlight unit comprises: a bottom cover; and a module board disposed in the bottom cover, wherein the module board includes a member having a hole, a light emitting diode in the hole, and a resin material in the hole.

In further another embodiment, a display apparatus comprises: a bottom cover; a light emitting module disposed in the bottom cover; at least one optical sheet on the light emitting module; and a display panel on the optical sheet, wherein the light emitting module includes: a module board having a plurality of holes; a light emitting diode in the hole; and a resin material in the hole.

The details of one or more embodiments are set forth in the accompanying drawings and the description below. Other features will be apparent from the description and drawings, and from the claims.

DETAILED DESCRIPTION OF THE EMBODIMENTS

Figure 1:
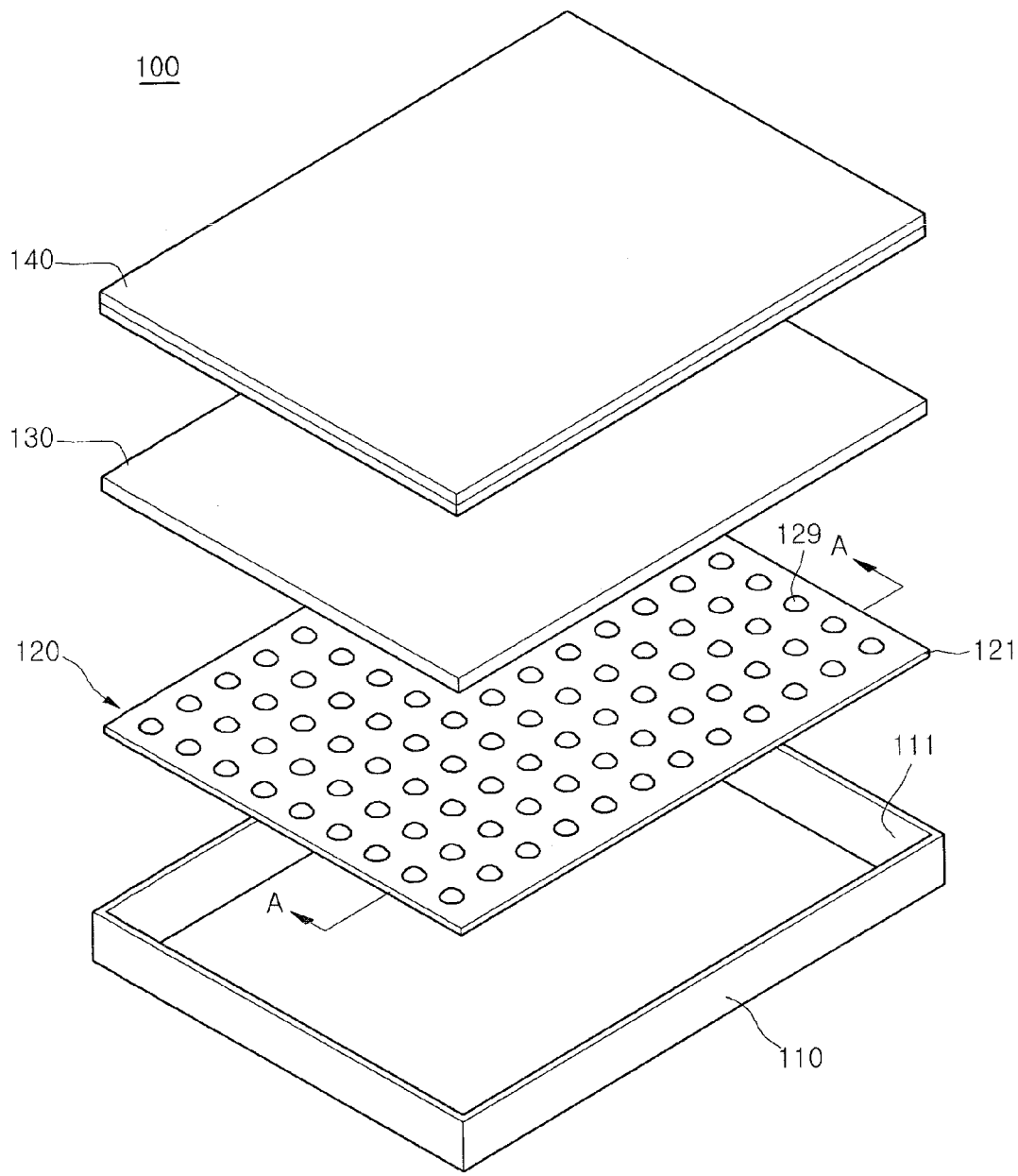
FIG. 1 is an exploded perspective view illustrating a display apparatus according to an embodiment.

Reference will now be made in detail to the embodiments of the present disclosure, examples of which are illustrated in the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, embodiments will be described with reference to the accompanying drawings.

Figure 2:
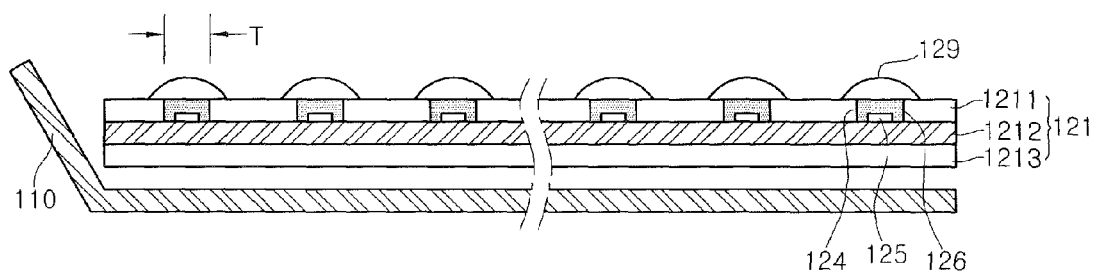
FIG. 2 is a cross-sectional view taken along line A-A of FIG. 1.

FIG. 1 is an exploded perspective view illustrating a display apparatus according to an embodiment. FIG. 2 is a cross-sectional view taken along line A-A of FIG. 1.

Referring to FIG. 1, a display apparatus 100 comprises a bottom cover 110, a light emitting module 120, an optical sheet 130, and a display panel 140.

The bottom cover 110 may have a predetermined depth from an upper border thereof. A peripheral surface 111 along the upper border may be perpendicular to a bottom surface of the bottom cover 110, or be inclined to the exterior thereof, and functions as a reflective cup.

The bottom cover 110 may be formed of aluminum (Al), magnesium (Mg), zinc (Zn), titanium (Ti), tantalum (Ta), hafnium (Hf), or niobium (Nb), but the embodiment is not limited thereto.

The light emitting module 120 is disposed on the bottom cover 110. The optical sheet 130 and the display panel 140 may be disposed on the light emitting module 120.

In more detail, referring to FIG. 2, the light emitting module 120 may comprise a module board 121, light emitting diodes 125, and a resin material 126. The light emitting module 120 may further comprise lenses 129 that are disposed on the resin material 126 to improve the optical efficiency of the light emitting module 120.

The module board 121 may comprise a printed circuit board (PCB) transmitting an electrical signal through a printed circuit pattern. That is, the module board 121 comprises a PCB configured to transmit an electrical signal for driving the light emitting diodes 125, and the PCB may be a flexible PCB, a metal PCB, or a typical PCB.

For convenience in descriptions of the following embodiments, it is presumed that a PCB integrally formed with light emitting diodes is constituted by three members.

In more detail, the module board 121 may comprise a photo solder resist (PSR) layer 1211 as a first member, an electrical conduction layer 1212 as a second member, and an insulation layer 1213 as a third member, and the electrical conduction layer 1212 may be formed of copper. However, the material and structure of the PCB are not limited within the scope of the present disclosure. Further, for example, the number of members constituting a PCB may be greater than three.

In the embodiment of FIG. 2, the light emitting diodes 125 are disposed on the electrical conduction layer 1212 of the module board 121.

That is, holes 124 may be formed in the PSR layer 1211 of the module board 121 as the PCB. The holes 124 may be spaced a predetermined distance from each other in at least one line, or be arranged in a plurality of lines in a zigzag shape.

The electrical conduction layer 1212 of the module board 121 is partially exposed through the holes 124, and the light emitting diodes 125 are installed in the form of a chip on the exposed electrical conduction layer 1212. A method of installing the light emitting diodes 125 may be one of flip-chip, die bonding, and wire bonding. The light emitting diode 125 comprises at least one of an ultra violet light emitting diode (UV LED) chip and a color LED chip such as a red LED chip, a green LED chip, and blue LED chip.

The resin material 126 is formed in the holes 124, and the resin material 126 may comprise silicone or epoxy. A phosphor may be added to the resin material 126, and the type of the phosphor may be determined according to a relationship between light from the light emitting diodes 125 and target light. At least one of a red phosphor, a green phosphor, and a blue phosphor may be added to the resin material 126.

The upper surface of the resin material 126 may be flat, concave, or convex, but the present disclosure is not limited thereto.

The lens 129 may be disposed on the resin material 126. The lens 129 may be attached to the resin material 126, or be formed using a transfer molding method. The lens 129 has a convex lens shape on the upper surface of the module board 121, and may have a diameter greater than a diameter T of the hole 124.

The light emitting module 120 formed by packaging the light emitting diodes 125 and the resin material 126 in the module board 121 is more economical than a light emitting module including a separate LED package. That is, since the PCB disposed on the bottom cover 110 is used as a member on which the light emitting diodes 125 can be installed, a configuration for the light emitting diodes 125 is simplified, thereby reducing material costs.

In addition, heat generated while the light emitting diodes 125 are driven can be more efficiently emitted through the electrical conduction layer 1212 of the module board 121 and the bottom cover 110 under the electrical conduction layer 1212. That is, since a distance between the light emitting module 120 and the bottom cover 110 is shorter than a distance between a bottom cover and a light emitting module including a separate LED package, the heat emission characteristics of the light emitting module 120 can be improved.

Referring again to FIG. 1, the optical sheet 130 may be spaced a predetermined distance from the upper portion of the light emitting module 120, and may comprise at least one sheet and/or at least one type of an optical sheet. The optical sheet 130 may selectively comprise a diffusion sheet, a prism sheet, a brightness enhancement film, and a protective sheet.

The display panel 140 is disposed on the optical sheet 130. The display panel 140 may comprise a liquid crystal panel, and display information using light emitted from the light emitting module 120.

The bottom cover 110, the light emitting module 120, and the optical sheet 130 may be defined as a backlight unit that provides light from the light emitting module 120 to the display panel 140 by diffusing and collecting the light.

Figure 3:
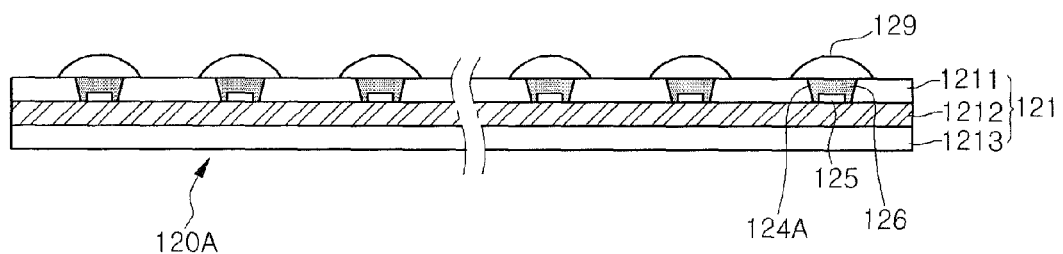
FIG. 3 is a cross-sectional view illustrating a light emitting module according to an embodiment.

FIG. 3 is a cross-sectional view illustrating a light emitting module according to an embodiment. Like reference numerals denote like elements in the current embodiment and the embodiment of FIG. 2, and a description of the same parts will be omitted here.

Referring to FIG. 3, a light emitting module 120A comprises holes 124A that have inclined structures in the PSR layer 1211 as the first member of the module board 121. The hole 124A is formed in an inclined structure with an upper diameter greater than a lower diameter, and a portion of light emitted from the light emitting diode 125 is reflected upward by a periphery of the hole 124A. Thus, the efficiency of light emitted from the light emitting diodes 125 of the light emitting module 120 can be increased.

Figure 4:
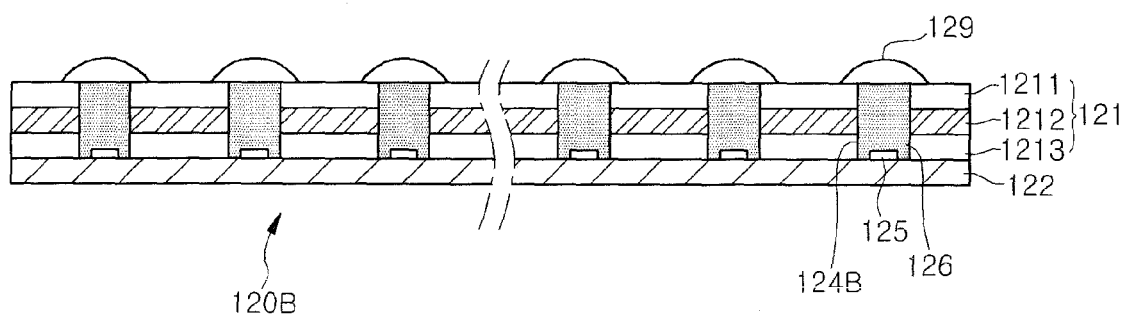
FIG. 4 is a cross-sectional view illustrating a light emitting module according to another embodiment.

FIG. 4 is a cross-sectional view illustrating a light emitting module according to another embodiment. Like reference numerals denote like elements in the current embodiment and the embodiment of FIG. 2, and a description of the same parts will be omitted here.

The heat emission characteristics are further improved in the current embodiment than in than the embodiment of the FIG. 2.

Referring to FIG. 4, a light emitting module 120B according to the current embodiment may comprise the module board 121, the light emitting diodes 125, and the resin material 126, and may further comprise the lenses 129 that are disposed on the resin material 126 to improve the optical efficiency thereof.

The module board 121 may be constituted by a PCB for transmitting an electrical signal through a printed circuit pattern, and comprise the PSR layer 1211 as a first member, the electrical conduction layer 1212 as a second member, and the insulation layer 1213 as a third member. The electrical conduction layer 1212 may be copper. In the current embodiment, holes 124B provided with the light emitting diodes 125 are formed in all of the PSR layer 1211, the electrical conduction layer 1212, and the insulation layer 1213 of the module board 121.

That is, the holes 124B pass through the PSR layer 1211, the electrical conduction layer 1212, and the insulation layer 1213.

A metal layer 122 for improving the heat emission characteristics is disposed at the lower side of the module board 121, that is, at the lower side of the insulation layer 1213. The lower surface of the insulation layer 1213 may be plated with a metal to form the metal layer 122. The metal layer 122 may be formed of titanium (Ti) that has excellent thermal conductivity, but the present disclosure is not limited thereto.

Since the metal layer 122 is formed between the module board 121 and the bottom cover 110, heat generated while the light emitting diodes 125 are driven can be further efficiently emitted to the bottom cover 110.

The light emitting diodes 125 are installed on the metal layer 122, and the resin material 126 are formed in the holes 124, and the lenses 129 are formed on the resin material 126, as described above.

Figure 5:
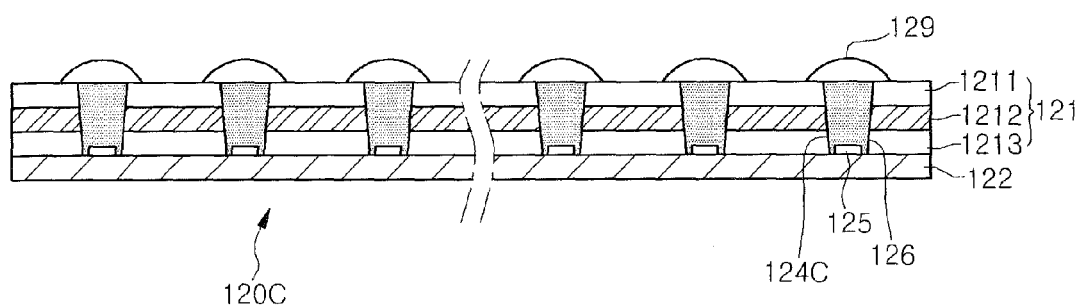
FIG. 5 is a cross-sectional view illustrating a light emitting module according to another embodiment.

FIG. 5 is a cross-sectional view illustrating a light emitting module according to another embodiment. Like reference numerals denote like elements in the current embodiment and the embodiments of FIGS. 2 to 4, and a description of the same parts will be omitted here.

Referring to FIG. 5, a light emitting module 120C according to the current embodiment comprises holes 124C in inclined structures. The holes 124C pass through the PSR layer 1211, the electrical conduction layer 1212, and the insulation layer 1213 of the module board 121. The hole 124C is formed in an inclined structure with an upper diameter greater than a lower diameter, and a portion of light emitted from the light emitting diode 125 is reflected upward by a periphery of the hole 124C. Thus, the efficiency of light emitted from the light emitting diodes 125 of the light emitting module 120 can be increased, and the heat emission efficiency can be improved.

In the light emitting module, the backlight unit, and the display apparatus including the backlight unit according to the embodiments, the light emitting devices such as LEDs can be integrally formed with the PCB, thereby reducing material costs and improving the heat emission efficiency of the light emitting devices.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. The light emitting module comprising:
   a module board including a plurality of holes;
   a light emitting diode disposed in the hole; and
   a resin material disposed in the hole,
   wherein the module board includes a printed circuit board (PCB) having a photo solder resist (PSR) layer, an electrical conduction layer, and an insulation layer, and
   wherein the hole is formed in an inclined structure with an upper diameter greater than a lower diameter.

2. The light emitting module according to claim 1, wherein the electrical conduction layer is formed of copper.

3. The light emitting module according to claim 1, wherein the hole is disposed in the PSR layer.

4. The light emitting module according to claim 1, wherein the light emitting diode is disposed on the electrical conduction layer.

5. The light emitting module according to claim 1, wherein the resin material comprises a phosphor.

6. The light emitting module according to claim 5, wherein the phosphor comprises at least one of red, green, and blue phosphors.

7. The light emitting module according to claim 1, further comprising a lens on the resin material.

8. A backlight unit comprising:
   a bottom cover; and
   a module board disposed in the bottom cover,
   wherein the module board includes a member having a hole, a light emitting diode in the hole, and a resin material in the hole, and
   wherein the hole is formed in an inclined structure with an upper diameter greater than a lower diameter.

9. The backlight unit according to claim 8, wherein the module board comprises a photo solder resist (PSR) layer, an electrical conduction layer, and an insulation layer, and the hole is disposed in the PSR layer.

10. The backlight unit according to claim 8, further comprising a metal layer between the module board and the bottom cover.

11. The backlight unit according to claim 10, wherein the hole passes through the PSR layer, the electrical conduction layer, and the insulation layer.

12. The backlight unit according to claim 10, wherein the metal layer is disposed on a lower surface of the insulation layer of the module board.

13. The backlight unit according to claim 10, wherein the metal layer is formed of titanium.

14. The backlight unit according to claim 10, wherein the light emitting diode is disposed on the metal layer.

15. A display apparatus comprising:
   a bottom cover;
   a light emitting module disposed in the bottom cover;
   at least one optical sheet disposed on the light emitting module; and
   a display panel disposed on the optical sheet,
   wherein the light emitting module includes a module board having a plurality of holes, a light emitting diode in the hole, and a resin material in the hole, and
   wherein the hole is formed in an inclined structure with an upper diameter greater than a lower diameter.

16. The display apparatus according to claim 15, wherein the module board comprises a photo solder resist (PSR) layer, an electrical conduction layer, and an insulation layer, and the hole is disposed in the PSR layer.

17. The display apparatus according to claim 16, wherein the light emitting diode is disposed on the electrical conduction layer.

* * * * *